United States Patent
Ikeda

(10) Patent No.: US 11,381,234 B2
(45) Date of Patent: Jul. 5, 2022

(54) ELECTRONIC CIRCUITRY AND ELECTRONIC APPARATUS

(71) Applicant: KABUSHIKI KAISHA TOSHIBA, Tokyo (JP)

(72) Inventor: Kentaro Ikeda, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/196,748

(22) Filed: Mar. 9, 2021

(65) Prior Publication Data
US 2022/0077849 A1 Mar. 10, 2022

(30) Foreign Application Priority Data
Sep. 4, 2020 (JP) .............................. JP2020-149280

(51) Int. Cl.
| | | |
|---|---|---|
| *H03K 17/00* | (2006.01) | |
| *H03K 17/687* | (2006.01) | |
| *G05F 1/10* | (2006.01) | |
| *H02M 1/32* | (2007.01) | |
| *H03K 17/082* | (2006.01) | |
| *H03K 17/693* | (2006.01) | |
| *H03K 17/567* | (2006.01) | |

(52) U.S. Cl.
CPC ....... *H03K 17/0828* (2013.01); *H03K 17/567* (2013.01); *H03K 17/693* (2013.01)

(58) Field of Classification Search
None
See application file for complete search history.

(56) References Cited

U.S. PATENT DOCUMENTS

| | | | |
|---|---|---|---|
| 7,671,636 B2 | 3/2010 | Aoki et al. | |
| 8,050,064 B2 * | 11/2011 | Kuno ................... | H03K 17/166 363/56.05 |
| 8,742,826 B2 * | 6/2014 | Furuya ............. | H03K 19/00346 327/427 |
| 2007/0187217 A1 * | 8/2007 | Tai .......................... | H02M 1/08 200/237 |
| 2021/0126449 A1 | 4/2021 | Ikeda | |

FOREIGN PATENT DOCUMENTS

| | | |
|---|---|---|
| JP | 2008-67140 A | 3/2008 |
| JP | 2021-69184 A | 4/2021 |

OTHER PUBLICATIONS

Kentaro Ikeda, U.S. Appl. No. 17/017,173, filed Sep. 10, 2020.

* cited by examiner

*Primary Examiner* — Kenneth B Wells
(74) *Attorney, Agent, or Firm* — Finnegan, Henderson, Farabow, Garrett & Dunner, L.L.P.

(57) ABSTRACT

According to one embodiment, electronic circuitry includes a first surge voltage detection circuit configured to detect a surge voltage generated due to switching of a switching device and generate a first signal indicating a first current; and a current generation circuit configured to generate a second current larger than the first current by amplifying a current in response to input of the first signal and output the second current to a control terminal of the switching device.

20 Claims, 18 Drawing Sheets

ELECTRONIC CIRCUITRY AND ELECTRONIC APPARATUS

CROSS REFERENCE TO RELATED APPLICATIONS

This application is based upon and claims the benefit of priority from the prior Japanese Patent Application No. 2020-149280, filed on Sep. 4, 2020, the entire contents of which are incorporated herein by reference.

FIELD

Embodiment described herein relate to electronic circuitry and an electronic apparatus.

BACKGROUND

A surge voltage control circuit for suppressing a surge voltage generated due to switching of a transistor has been known. As an example, a configuration has been known in which a capacitor is arranged to be electrically coupled at a portion where the surge voltage is generated and a displacement current of the capacitor is input to a control terminal of the transistor to suppress the surge voltage.

However, there has been a problem that the displacement current of the capacitor is partially absorbed by a gate driver, and as a result, the current input to the control terminal is decreased, which lowers the effect of suppressing the surge voltage.

To overcome this problem, a possible way is to increase the capacity of the capacitor. However, a capacitor having a high withstand voltage requires a high cost. In addition, when the capacity of the capacitor is increased to increase the displacement current supplied to the transistor, oscillation of the transistor may occur due to the effect of a parasitic inductance on the path of the displacement current. This causes a malfunction of the transistor.

DETAILED DESCRIPTION

According to one embodiment, electronic circuitry includes a first surge voltage detection circuit configured to detect a surge voltage generated due to switching of a switching device and generate a first signal indicating a first current; and a current generation circuit configured to generate a second current larger than the first current by amplifying a current in response to input of the first signal and output the second current to a control terminal of the switching device.

Embodiments of the present invention will be described below with reference to the drawings. Although main components of electronic circuitry and a power converter will be mainly described below, the electronic circuitry and the power converter may include components and functions that are not illustrated or described. The following description does not exclude components and functions that are not illustrated or described.

First Embodiment

Figure 1:
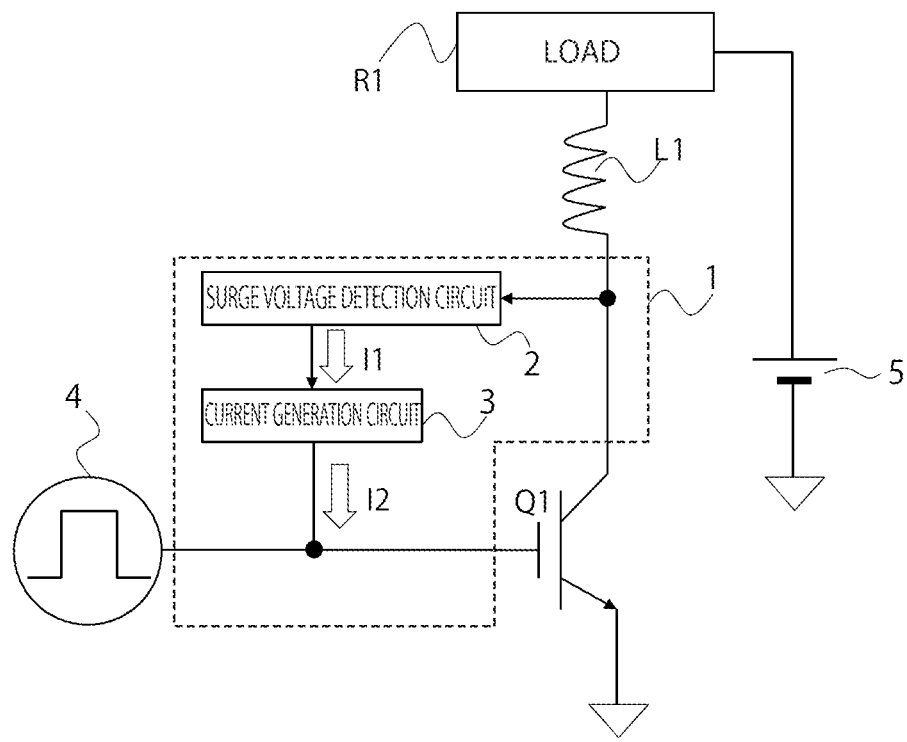
FIG. 1 is a circuit diagram of a surge voltage control circuit, which is electronic circuitry according to a first embodiment.

FIG. 1 is a circuit diagram of a surge voltage control circuit 1, which is electronic circuitry according to a first embodiment. The surge voltage control circuit 1 in FIG. 1 suppresses a surge voltage generated due to switching of a transistor Q1, which is a switching device. The transistor Q1 is a switching device such as an IGBT (Insulated Gate Bipolar Transistor) or a MOS (Metal-Oxide-Semiconductor) transistor, and the type of the switching device is not specifically limited. The transistor Q1 controls a current flowing between a first terminal (or a first electrode) and a second terminal (or a second electrode) according to a voltage applied to a control terminal (or a control electrode).

When the transistor Q1 is an IGBT, the control terminal is a gate, the first terminal is a collector, and the second terminal is an emitter. When the transistor Q1 is an N-type MOSFET, the control terminal is a gate, the first terminal is a drain, and the second terminal is a source. FIG. 1 shows an example in which the transistor Q1 is an IGBT.

The surge voltage control circuit 1 in FIG. 1 includes a surge voltage detection circuit 2 and a current generation circuit A parasitic inductance L1, a load (such as resistive, inductive, or capacitive) R1 and a DC power supply 5 are connected in series to the collector of the transistor Q1. A control signal generator 4 is connected to the gate of the transistor Q1. The control signal generator 4 generates a control signal in synchronization with a timing of switching the transistor Q1, and supplies the generated control signal to the gate of the transistor Q1. For example, the transistor Q1 is turned on when the control signal is at a high level, and the transistor Q1 is turned off when the control signal is at a low level. The relationship between the logic of the control signal and the on/off of the transistor Q1 may be arbitrary.

The surge voltage detection circuit 2 detects a surge voltage generated due to switching of the transistor Q1. Specifically, the surge voltage detection circuit 2 detects the voltage of the first terminal (collector) of the transistor Q1 when a surge occurs.

Figure 2:
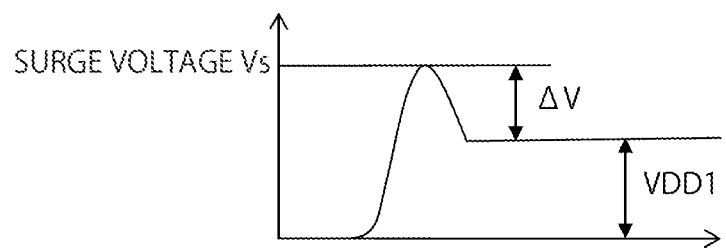
FIG. 2 is a diagram illustrating a surge voltage.

FIG. 2 is a diagram illustrating a surge voltage. A surge occurs when the collector voltage of the transistor Q1 exceeds the voltage "VDD1" of the DC power supply 5. The voltage when the voltage "VDD1" is exceeded is equal to the surge voltage "Vs". The difference between the surge voltage "Vs" and the voltage "VDD1" is equal to an overshoot voltage "Δ V".

The surge voltage detection circuit 2 generates a first signal indicating a current "I1", which is a first current, in response to detection of the surge voltage. The surge voltage detection circuit 2 provides the first signal indicating the current "I1" to the current generation circuit 3.

As an example, the surge voltage detection circuit 2 generates the first signal indicating the current "I1" based on a current input to the surge voltage detection circuit 2 in response to detection of the surge voltage (when the surge occurs).

Figure 3:
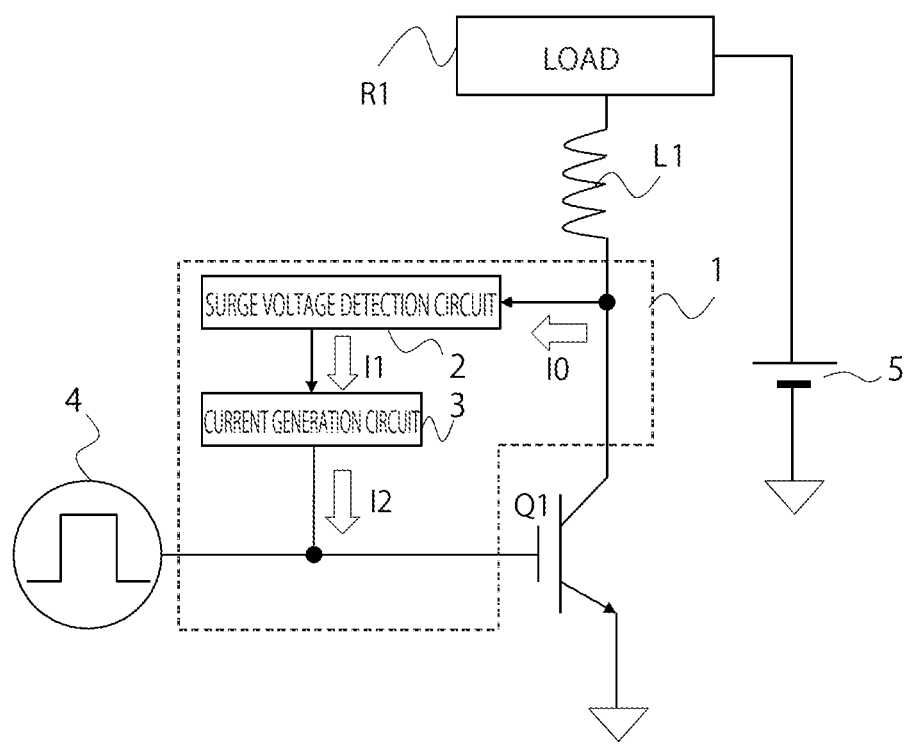
FIG. 3 is a diagram showing a current input to a surge voltage detection circuit when a surge occurs.

FIG. 3 is a diagram showing a current "I0" input to the surge voltage detection circuit 2 when a surge occurs. At least part of a current that causes the surge is input to the surge voltage detection circuit 2 as the current "I0". In this case, as an example, the current "I1" is the same as the current "I0" input to the surge voltage detection circuit 2. However, the current "I1" may be another current as long as it is a current corresponding to the current "I0".

The surge voltage detection circuit 2 generates the first signal based on the input current "I0". The first signal may be the waveform of the current "I0", or may be a digital signal obtained by converting values of the current "I0" into digital values. In the latter case, the surge voltage detection circuit 2 may include an AD conversion circuit.

Figure 4:
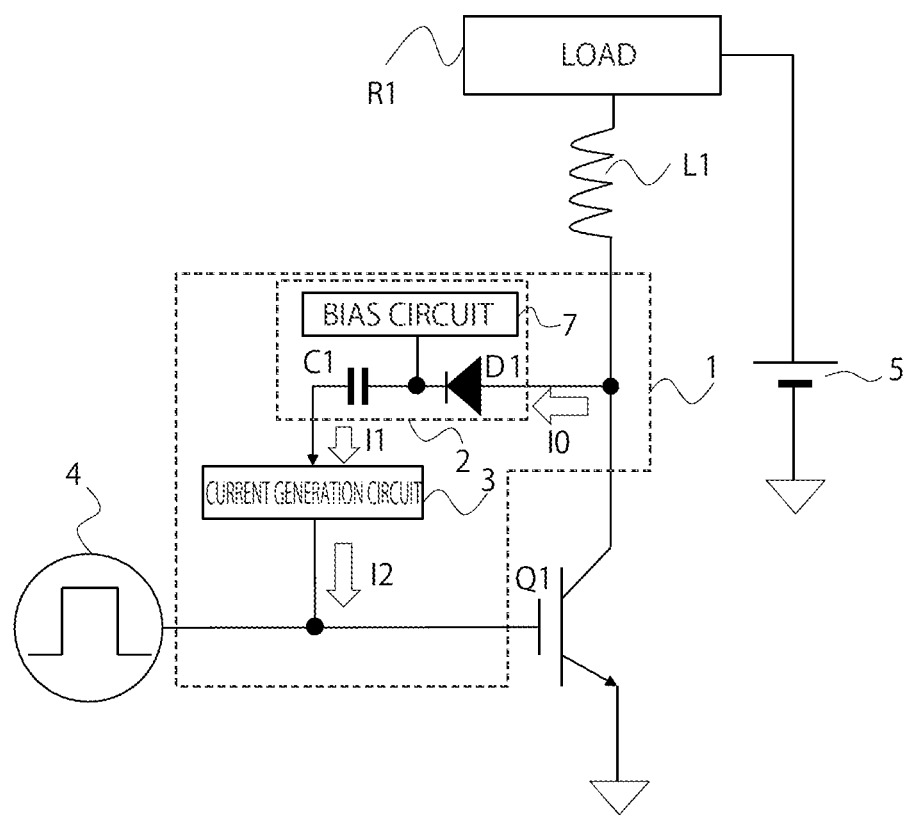
FIG. 4 is a diagram showing a configuration example of the surge voltage detection circuit.

FIG. 4 shows a configuration example of the surge voltage detection circuit 2. The surge voltage detection circuit 2 includes a diode D1, a capacitor C1, and a bias circuit 7.

The diode D1 passes at least part of a current that causes a surge generated due to switching of the transistor Q1. The capacitor C1 is connected between the cathode of the diode D1 and the gate of the transistor Q1. More specifically, the anode of the diode D1 is connected to the collector of the transistor Q1, and its cathode is connected to one end of the capacitor C1. The other end of the capacitor C1 is connected to the input terminal of the current generation circuit 3. The bias circuit 7 is connected at a node between the cathode of the diode D1 and the capacitor C1, and provides a bias voltage to the cathode of the diode D1. As an example, the bias circuit 7 includes a DC voltage source and a resistor connected in series between the node and a reference voltage. The specific circuit configuration of the bias circuit 7 may be arbitrary, such as a configuration including an inductor. The current "I0" flows into the diode D1 when the surge voltage becomes larger than the bias voltage, and the current "I0" is provided to the current generation circuit 3 via the capacitor C1 as the current "I1". More specifically, the displacement current of the capacitor C1 is provided to the current generation circuit 3 as the current "I1". In this case, the current "I1" corresponds to the first signal indicating the first current. An AD converter may be provided subsequent to the capacitor C1 so that a digital signal obtained by converting the analog signal of the current "I1" is provided to the current generation circuit 3.

Besides the configuration of generating the first signal based on the current input to the surge voltage detection circuit 2, the surge voltage detection circuit 2 may generate the first signal indicating the first current according to the magnitude of the detected surge voltage.

Figure 5:
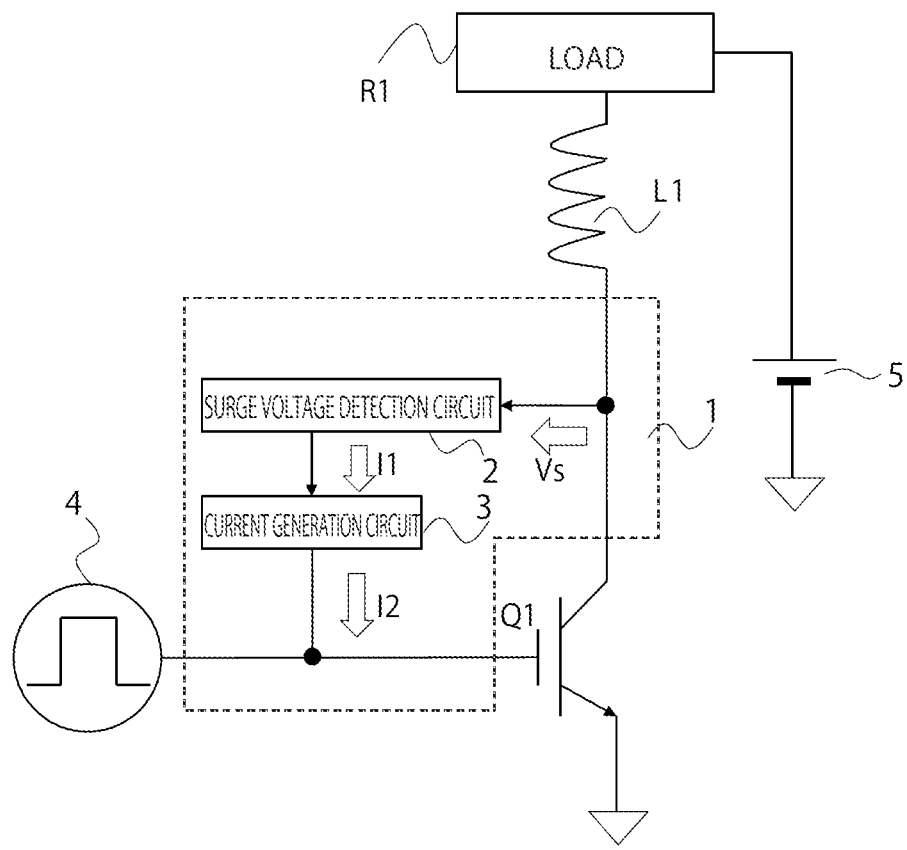
FIG. 5 is a diagram showing a surge voltage detected by the surge voltage detection circuit when a surge occurs.

FIG. 5 shows the surge voltage "Vs" detected by the surge voltage detection circuit 2 when a surge occurs. The surge voltage detection circuit 2 generates the current "I1" corresponding to the value of the surge voltage "Vs", and provides the first signal indicating the current "I1" to the current generation circuit 3. For example, as Vs is larger, the current "I1" generated has a larger value. As an example, the current "I1" may be generated from the surge voltage "Vs" by using a transistor. Alternatively, a digital signal obtained by converting the current "I1" into digital values may be provided to the current generation circuit 3 as the first signal. In this case, the surge voltage detection circuit 2 includes an AD conversion circuit for converting the current "I1" into digital values.

The current generation circuit 3 generates a second current (current "I2") that is larger than the first current indicated by the first signal by amplifying a current in response to input of the first signal provided from the surge voltage detection circuit 2. The current generation circuit 3 generates the second current by using a power supply different from the DC power supply 5. As an example, the current generation circuit 3 generates the second current (current "I2") by amplifying the first current (current "I1") using an amplifier circuit.

Figure 6:
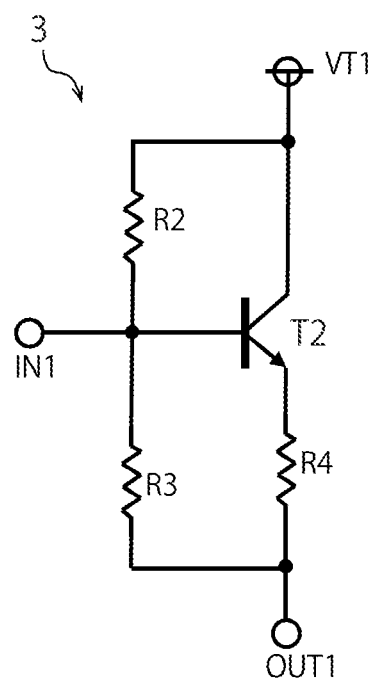
FIG. 6 is a diagram showing an example of a current generation circuit.

FIG. 6 shows an example of the current generation circuit 3. A bipolar transistor T2 has a base connected to a current input terminal IN1, a collector connected to a power terminal VT1, and an emitter connected to a current output terminal OUT1 via a resistor R4. The power terminal VT1 is connected to a power supply different from the DC power supply 8 in FIG. 1. The current input terminal IN1 is connected to the surge voltage detection circuit 2, and the current "I1" is input thereto. The current output terminal OUT1 is connected to the gate of the transistor Q1. The current "I1" is supplied to the base of the transistor T2 as a current corresponding to the voltage of a node between a resistor R2 and a resistor R3. A current amplified by the transistor T2 is output from the current output terminal OUT1 as the current "I2".

Figure 7:
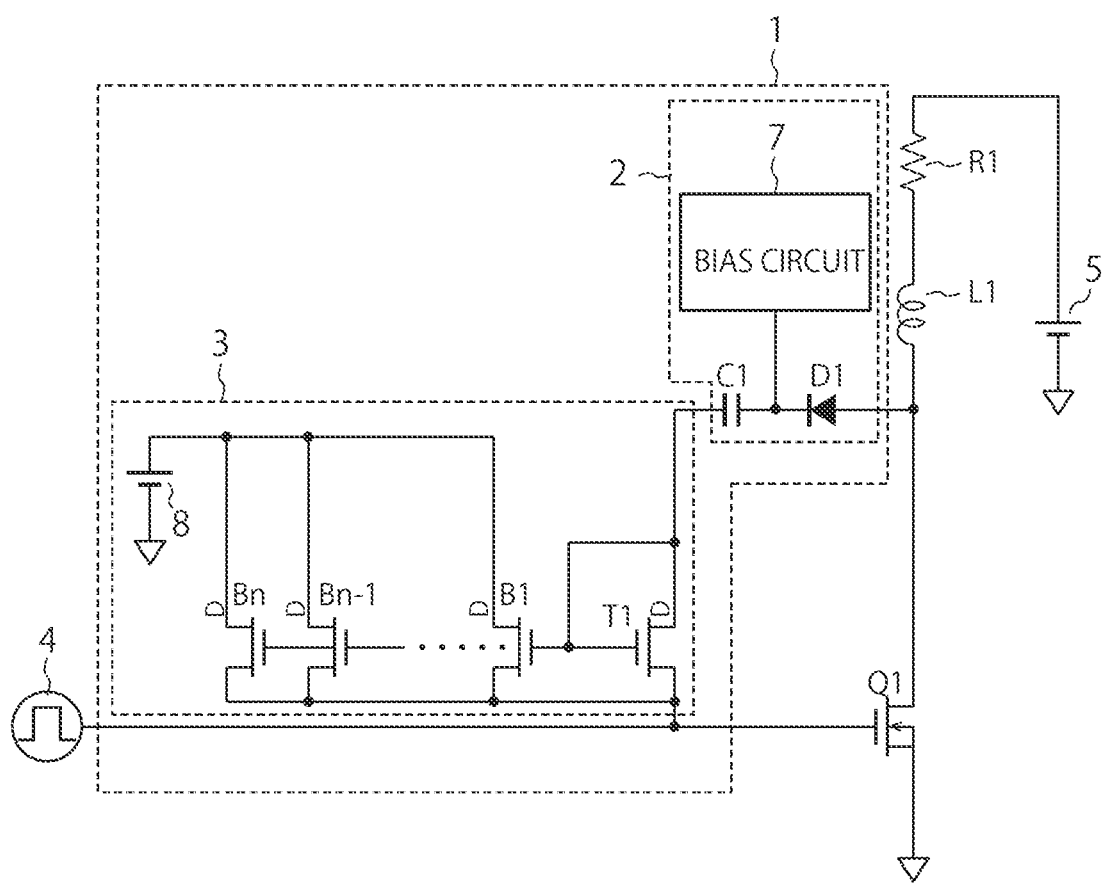
FIG. 7 is a diagram showing another example of the current generation circuit.

FIG. 7 shows another example of the current generation circuit 3. An N-type MOSFET is used as the transistor Q1 to be driven. However, an IGBT may also be used as in FIG. 1. The description of the bias circuit 7, the capacitor C1 and the diode D1 is the same as in FIG. 4 and will be omitted. The current generation circuit 3 is a current mirror circuit. The current mirror circuit is coupled between the capacitor C1 and the control terminal (gate) of the transistor Q1.

The current mirror circuit includes a transistor T1, which is a first transistor connected to the capacitor C1, and transistors B1 to Bn each having a control terminal connected to the control terminal of the transistor T1. Although the transistors T1 and B1 to Bn are N-type MOSFETs in the example of the figure, it may also be a current mirror circuit including P-type MOSFET transistors. The transistors B1 . . . , Bn−1 and Bn are connected in series to the DC power supply 8 between the gate of the transistor Q1 and a reference potential terminal. These transistors may also be bipolar transistors.

When the current (current "I1") flowing from the capacitor C1 is input to the drain of the transistor T1, amplified currents corresponding to the current "I1" are output from the transistors B1 to Bn, a composite current obtained by compositing the output currents is output from the current generation circuit 3 as the current "I2" (second current). The composite current is input to the gate of the transistor Q1.

When the first signal provided from the surge voltage detection circuit 2 indicates a digital value, the current generation circuit 3 may generate a current having a value corresponding to the digital value as the current "I2". For example, a number of switches corresponding to the digital value out of a plurality of switches connected to the power supply are turned on, and the composite current of currents flowing in the turned-on switches is used as the current "I2". Specific configuration examples of the current generation circuit 3 will be shown in other embodiments described later.

The current generation circuit 3 outputs the generated current "I2" to the control terminal of the transistor Q1. An operation of raising the gate voltage of the control terminal of the transistor Q1 is performed, and the surge voltage is suppressed.

The operation of the surge voltage control circuit 1 will be described. In a normal state, the transistor Q1 is turned on or off according to the logic of the control signal output from the control signal generator 4. When the transistor Q1 is an IGBT or an N-type MOS transistor, the gate of the transistor Q1 is at a high potential and the transistor Q1 is turned on when the control signal is at a high level, for example. When the control signal is at a low level, the gate of the transistor Q1 is at a low potential and the transistor Q1 is turned off. When the transistor Q1 is turned on, a current flows in a load R1 driven by the transistor Q1.

When the transistor Q1 performs a switching operation, a surge voltage may be generated on the collector side of the transistor Q1, for example. The surge voltage detection circuit 2 detects the generation of the surge voltage. The surge voltage detection circuit 2 generates the first signal indicating the current "I1" in response to detection of the surge voltage. As an example, the surge voltage detection circuit 2 generates the first signal indicating the current "I1" based on the current I0 (see FIG. 3) input to the surge voltage detection circuit 2. The current "I1" may be the same as the current "I0", or may be another current as long as it depends on the current "I0". The current "I1" indicated by the first signal is larger as the value of the surge voltage is larger or the current "I0" is larger. The current generation circuit 3 amplifies a current by using a power supply different from the DC power supply 5, and generates the second current (current "I2") that is larger than the current "I1" indicated by the first signal. The current generation circuit 3 supplies the generated current "I2" to the control terminal of the transistor Q1. A larger current flows into the control terminal of the transistor Q1 as the surge voltage is larger or the current input to the surge voltage detection circuit 2 is larger. This means that an operation of raising the gate voltage of the control terminal of the transistor Q1 is performed. The raising of the gate voltage causes a collector current to flow. In this manner, the surge voltage is suppressed.

Figure 8:
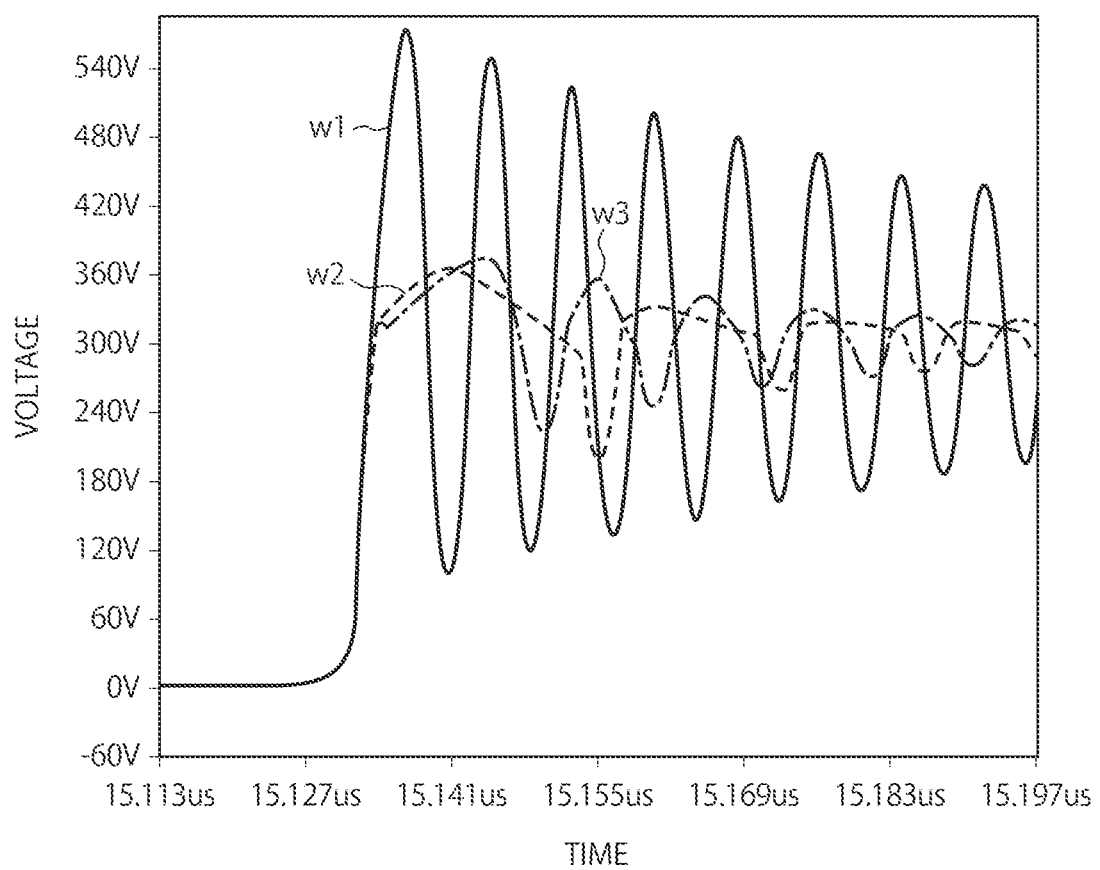
FIG. 8 is a diagram showing a result obtained by a simulation on an effect of the electronic circuitry of the present embodiment.

FIG. 8 shows a result obtained by a simulation on an effect of the electronic circuitry 1 of the present embodiment. The horizontal axis indicates time, and the vertical axis indicates corrector voltage (or drain voltage in the case of an N-type MOSFET). A waveform w1 shows the waveform of the corrector voltage when a surge occurs in the case where a surge voltage suppressing operation is not performed. A waveform w2 shows the response waveform of the corrector voltage when a surge occurs in the case where a surge voltage suppressing operation of a comparative example is performed. A waveform w3 shows the response waveform of the corrector voltage when a surge occurs in the case where a surge voltage suppressing operation of the present embodiment is performed. In the present embodiment, a capacitor having a capacity that is $1/10$ smaller than that of a capacitor in the comparative example is used in the surge voltage detection circuit. In the present embodiment, the capacitor having a capacity that is $1/10$ smaller than in the comparative example achieves an equivalent suppression effect.

As described above, according to the present embodiment, the current generation circuit 3 generates a current to be provided to the gate by amplification using a power supply different from the DC power supply 5 based on the first signal provided from the surge voltage detection circuit 2. Therefore, there is no need to directly connect the output of the surge voltage detection circuit 2 to the gate of the transistor Q1. The current supplied to the control terminal can be increased without using a capacitor having a large capacity in the surge voltage detection circuit 2. Thus, the surge voltage can be suppressed effectively. In addition, the capacity of the capacitor can be decreased, and therefore cost reduction can be achieved. At the same time, the displacement current of the capacitor is decreased, and therefore the effect of the parasitic inductance can be suppressed and the problem of oscillation can be suppressed.

Furthermore, according to the present embodiment, a current corresponding to the detected surge voltage is supplied from the surge voltage detection circuit 2 to the current generation circuit 3. In other words, although the withstand voltage of the current generation circuit 3 may be exceeded when the detected surge voltage is directly provided to the current generation circuit 3, the problem of withstand voltage can be prevented by providing the current. Since the current generation circuit is a circuit whose input is a current, a lower-voltage portion connected to the control terminal of the transistor Q1 and a higher-voltage portion to which the surge voltage detection circuit is connected can be directly connected to each other. Thus, by using the current generation circuit, it is possible to respond to a fast phenomenon such as the surge voltage.

Note that, in the present embodiment, it is not necessarily necessary to use a capacitor in the surge voltage detection circuit 2. A configuration in which the operation of generating the first signal described above is performed without using a capacitor is also possible.

(Variation 1)

Figure 9:
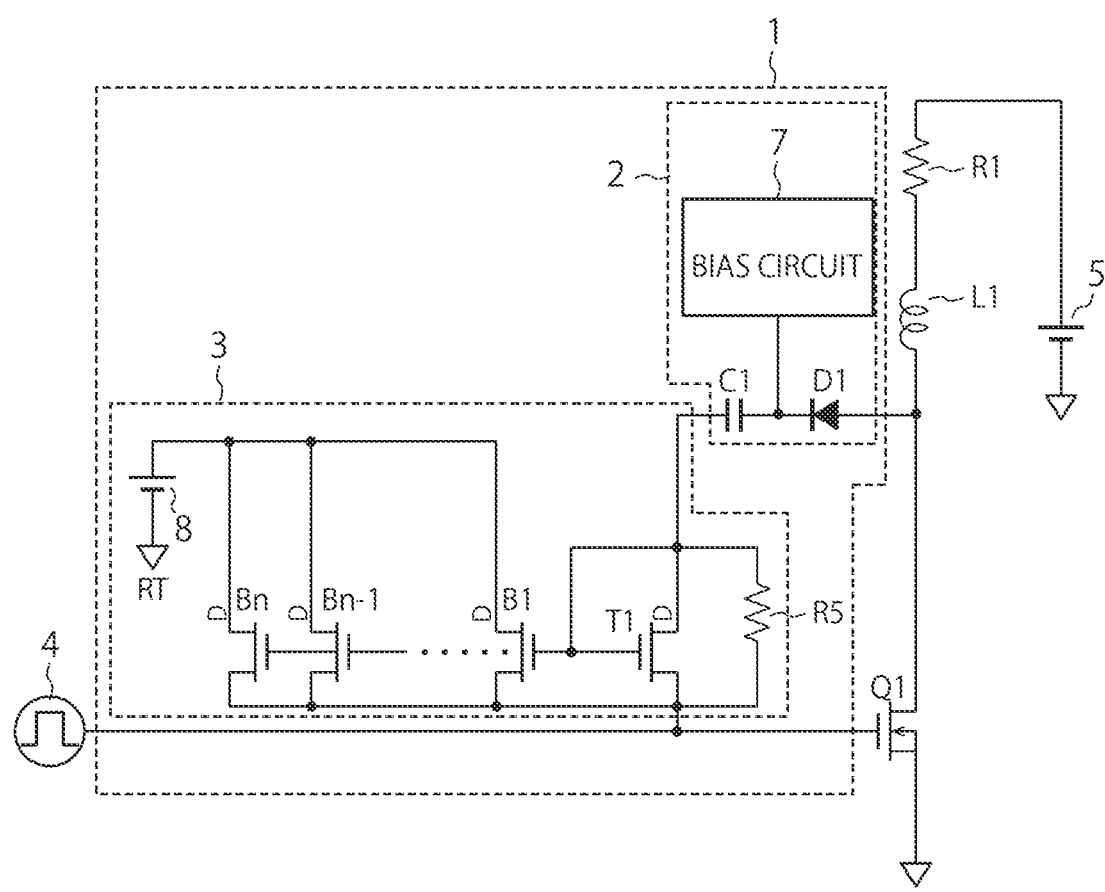
FIG. 9 shows a variation 1 of the surge voltage control circuit shown in FIG. 7.

FIG. 9 shows a variation 1 of the surge voltage control circuit shown in FIG. 7. A resistor R5 is added to the current mirror circuit, which is the current generation circuit 3. The resistor R5 has a resistance smaller than the gate leakage resistance (parasitic resistance) of the transistors T1 and B1 to Bn in the current mirror circuit. One end of the resistor R5 is connected to the control terminal of the transistor T1 and the capacitor C1, and the other end of the resistor R5 is connected to the source of the transistor T1 or the control terminal of the transistor Q1.

Even when no surge voltage is generated in the circuit including the transistor Q1, the current mirror circuit may output a current due to leakage current from the transistors T1 and B1 to Bn constituting the current mirror circuit. The resistor R5 is smaller than the parasitic resistance of the transistor T1, and thus can absorb this leakage current. This can prevent a malfunction of the current mirror circuit.

(Variation 2)

Figure 10:
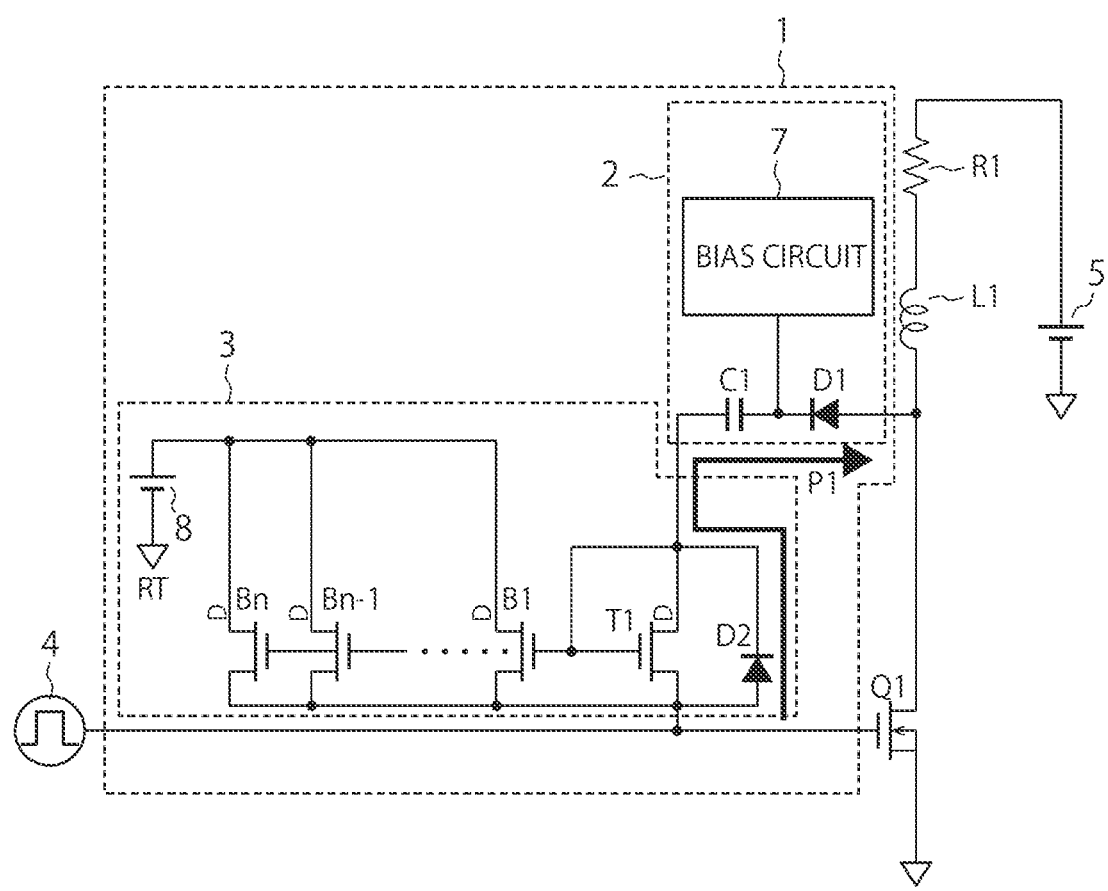
FIG. 10 shows a variation 2 of the surge voltage control circuit shown in FIG. 7.

FIG. 10 shows a variation 2 of the surge voltage control circuit shown in FIG. 7. A diode D2 is added to the current mirror circuit, which is the current generation circuit 3. The diode D2 is a second diode connected in series to the capacitor C1 and connected in parallel to the transistor T1. Specifically, the anode of the diode D2 is connected to the control terminal of the transistor Q1, and its cathode is connected to the capacitor C1.

At a timing when the generated surge voltage is decreased, the change in voltage causes a current to flow from the current generation circuit 3 (current mirror circuit) toward the surge voltage detection circuit 2. This current flows into the surge voltage detection circuit 2 via the diode D2. A path P1 of this current is shown in the figure. In this manner, the reverse breakdown of the transistors T1 and B1 to Bn constituting the current mirror circuit can be prevented, and the reliability of the surge voltage control circuit 2 can be improved. The configuration in which the diode D2 is provided is particularly effective when the transistors constituting the current mirror circuit are bipolar transistors.

(Variation 3)

Figure 11:
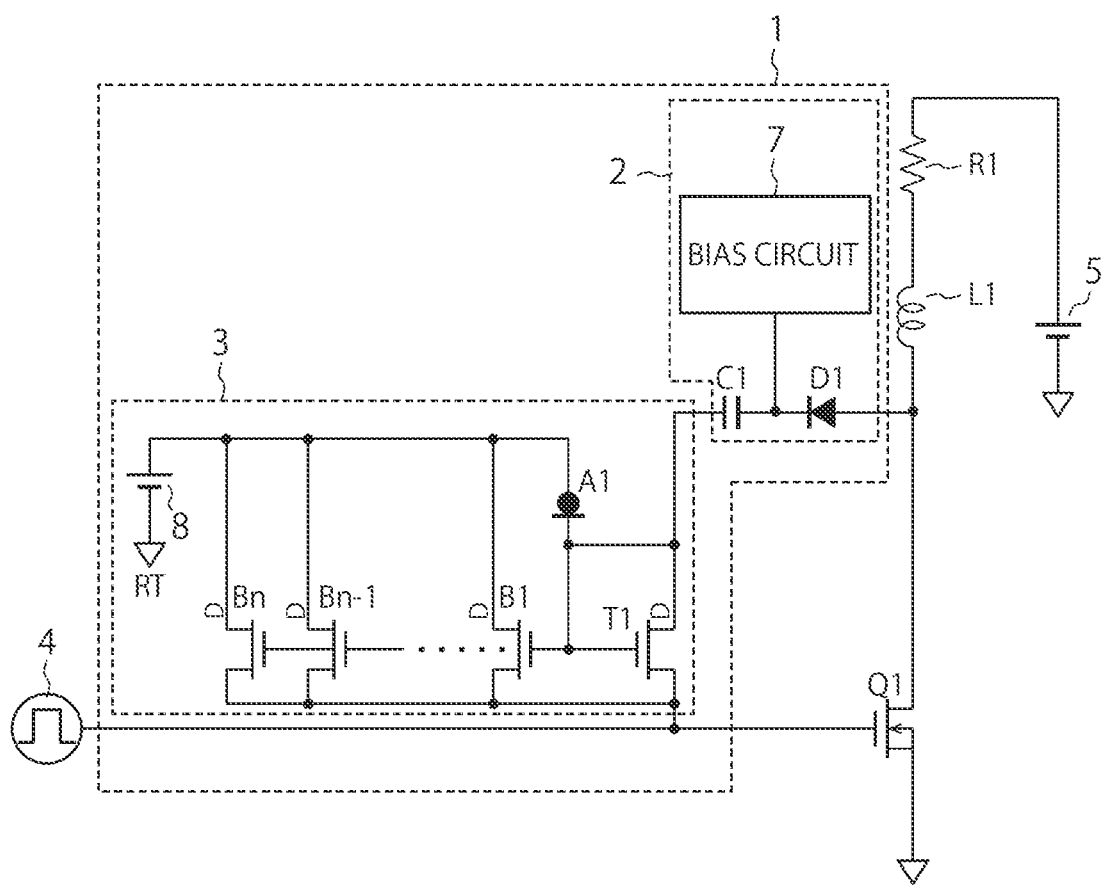
FIG. 11 shows a variation 3 of the surge voltage control circuit shown in FIG. 7.

FIG. 11 shows a variation 3 of the surge voltage control circuit shown in FIG. 7. A current bias circuit A1 for supplying a bias current is connected to the control terminal of the transistor T1 constituting the current mirror circuit, which is the current generation circuit 3. As an example of the current bias circuit A1, a constant current source, a resistor or the like can be used. The current bias circuit A1 supplies a minute current as the bias current to the control terminal of the transistor T1 of the current mirror circuit. In this manner, the responsibility of the current mirror circuit can be improved, so that the operation of the current mirror circuit can be started quickly after the detection of the surge voltage.

In other words, when the current bias circuit A1 is not provided and the voltages of the control terminals of the transistors T1 and B1 to Bn constituting the current mirror circuit are lower than a threshold, it takes time to start the operation of the current mirror circuit after the detection of the surge voltage. Thus, the timing of suppressing the surge voltage is delayed. In the present embodiment, since the current bias circuit A1 supplies a minute current to the control terminal of the transistor T1 of the current mirror circuit, the current mirror circuit can be operated quickly after the detection of the surge voltage. In this manner, the surge voltage can be suppressed effectively.

However, when this minute current is too large, power consumption is increased. Therefore, it is desirable that the output current of the current mirror circuit when no surge voltage is generated is less than or equal to an allowable value (for example, 0.1 mA or less). The variations 1 to 3 have been described above, and these variations can be applied in combination.

Second Embodiment

Figure 12:
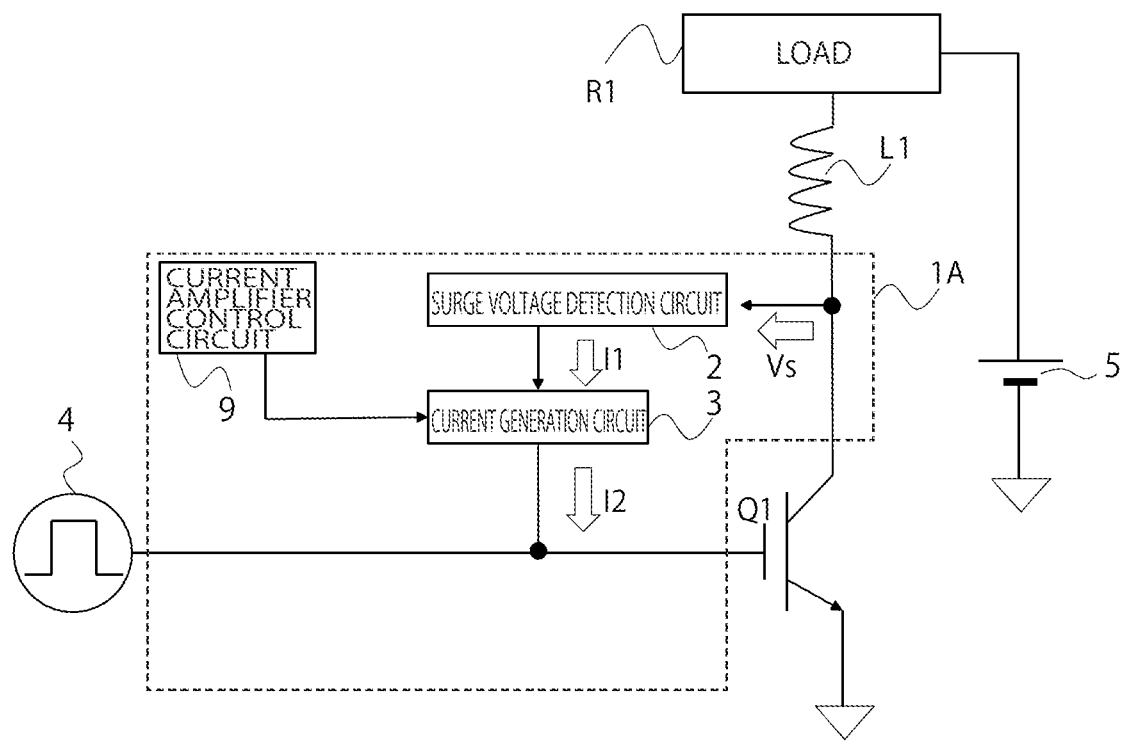
FIG. 12 is a circuit diagram of a surge voltage control circuit, which is electronic circuitry according to a second embodiment.

FIG. 12 is a circuit diagram of a surge voltage control circuit 1A, which is electronic circuitry according to a second embodiment. A current amplifier control circuit 9 for controlling the current generation circuit 3 is provided.

The current amplifier control circuit 9 allows the gain (amplification gain) of the current of the current generation circuit 3 to be variable. For example, the current "I1" supplied to the current generation circuit 3 is multiplied by N. The current generation circuit 3 outputs the current obtained by multiplying the current "I1" by N.

Figure 13:
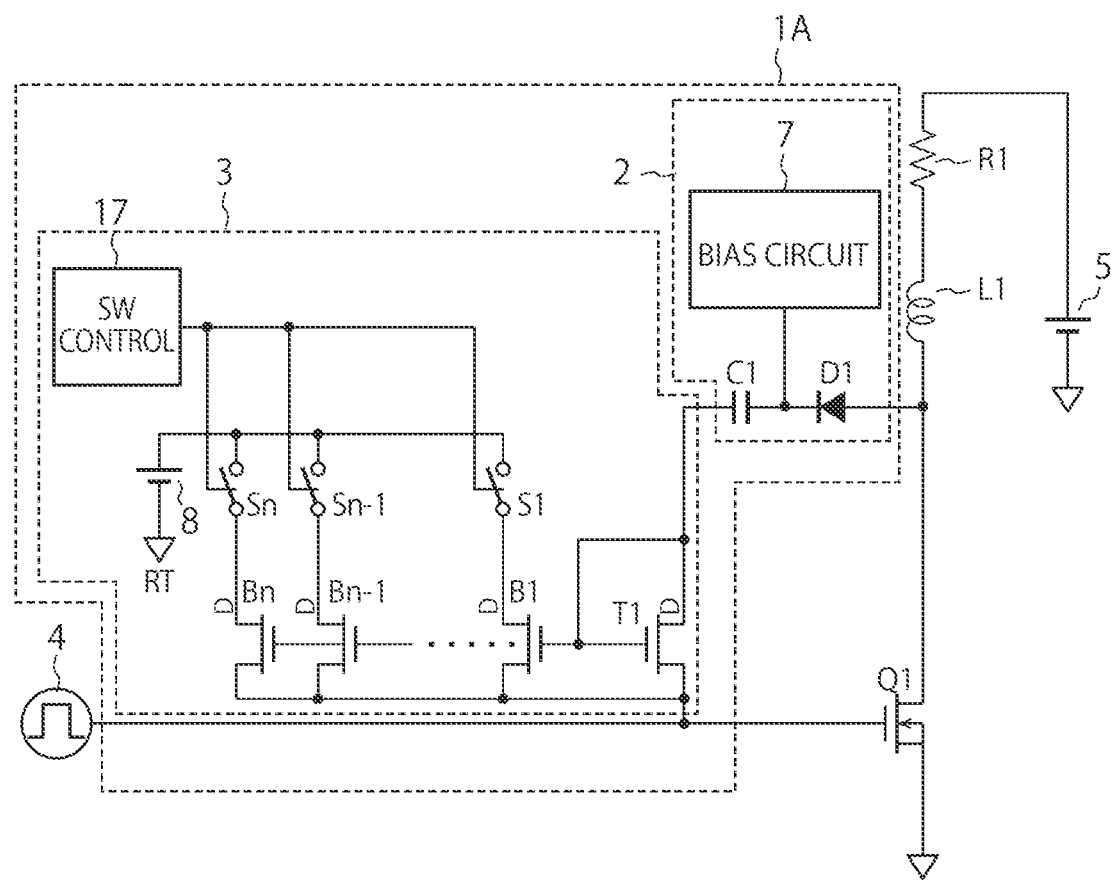
FIG. 13 is a diagram showing a specific example of a current amplifier control circuit.

FIG. 13 is a diagram showing a specific example of the current amplifier control circuit 9. The current amplifier control circuit 9 in FIG. 13 controls the current mirror circuit, which is the current generation circuit 3 shown in FIG. 7. Note that an N-type MOSFET is used as the transistor Q1. Switches S1 . . . Sn−1 and Sn are connected to the transistors B1 to Bn. The current amplifier control circuit 9 is constituted as a switch control circuit (SW control circuit) 17 for controlling the switches S1 to Sn to be turned on or off.

The switch control circuit 17 controls a current amplification gain by controlling the number of switches to be turned on. For example, when the transistors B1 to Bn have a configuration of amplifying the current of the transistor T1 by one time, N switches are turned on in order to amplify the current of the transistor T1 by N times. In addition, when the currents passed by the transistors B1 to Bn are at least partially different, transistors to be operated are determined according to the current "I2" to be output, and the corresponding switches are turned on.

As an example, when the surge voltage is larger than a target value, the current amplification gain is set to be high such as by increasing the number of switches to be turned on (increasing the amplification gain) or turning on switches corresponding to transistors having a high amplification gain. In this case, the output current of the current generation circuit 3 is increased, and the effect of suppressing the surge voltage is enhanced. Conversely, when the surge voltage is less than or equal to the target value, that is, when the surge voltage is excessively suppressed, the suppression of the surge voltage is relieved such as by decreasing the number of switches to be turned on (decreasing the amplification gain) or turning off switches corresponding to transistors having a high amplification gain. A configuration example of the current generation circuit 3 for this case is shown in FIG. 14.

Figure 14:
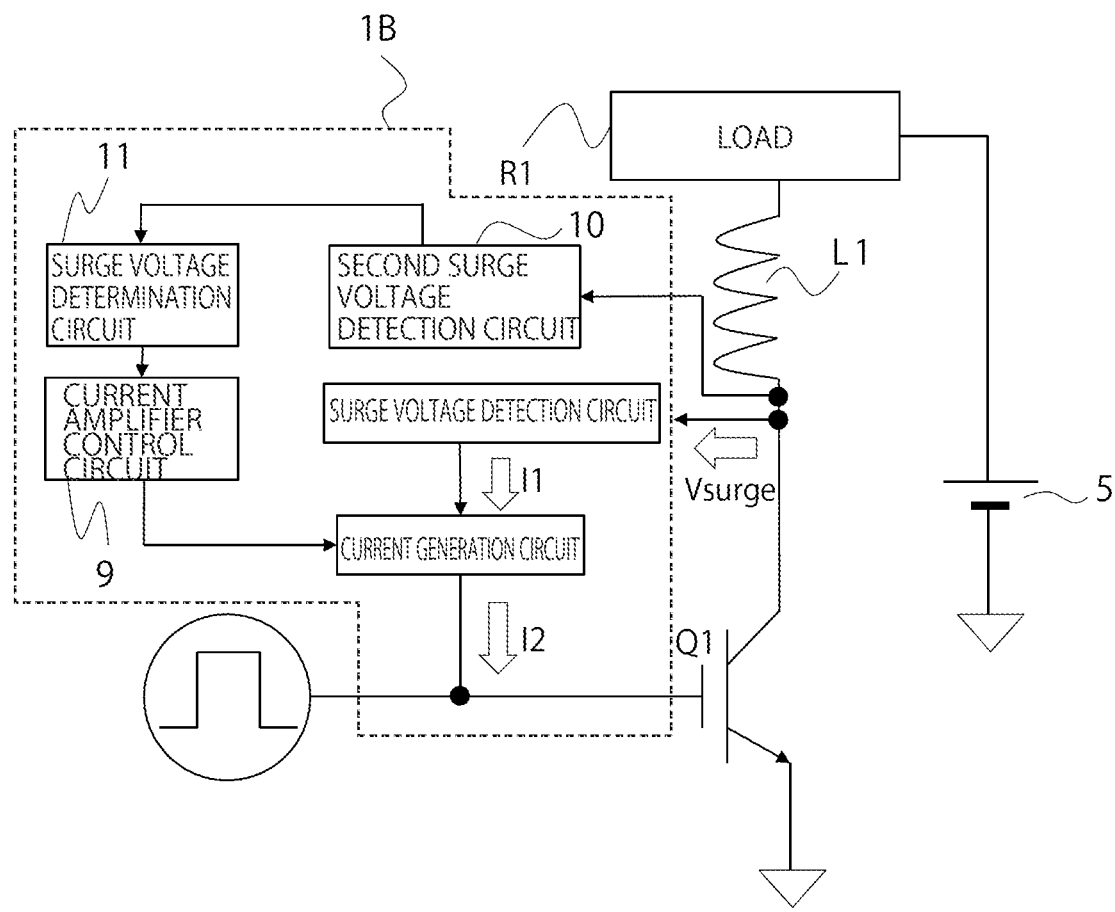
FIG. 14 shows a configuration example in which a second surge voltage detection circuit and a surge voltage determination circuit are added to the surge voltage control circuit in FIG. 12.

FIG. 14 shows a configuration of a surge voltage control circuit 1B in which a second surge voltage detection circuit 10 and a surge voltage determination circuit 11 are added to the surge voltage control circuit in FIG. 12. Circuits shown in FIG. 13 are used as specific examples of the surge voltage detection circuit 2, the current generation circuit 3 and the current amplifier control circuit 9.

The second surge voltage detection circuit 10 is connected to the collector of the transistor Q1 and detects the surge voltage. The surge voltage determination circuit 11 compares the detected surge voltage and a target value. When it is less than or equal to the target value, an indication signal to turn on X switches is provided to the current amplifier control circuit 9, and when it is larger than the target value, an indication signal to turn on Y switches, Y being more than X, is provided to the current amplifier control circuit 9. There may be a plurality of target values instead of one target value. In this case, the number of switches to be turned on may be determined for each target value. The current amplifier control circuit 9 turns on the number of switches indicated by the indication signal. Note that the adjustment of the amplification gain is not limited to adjusting the number of switches to be turned on.

Figure 15:
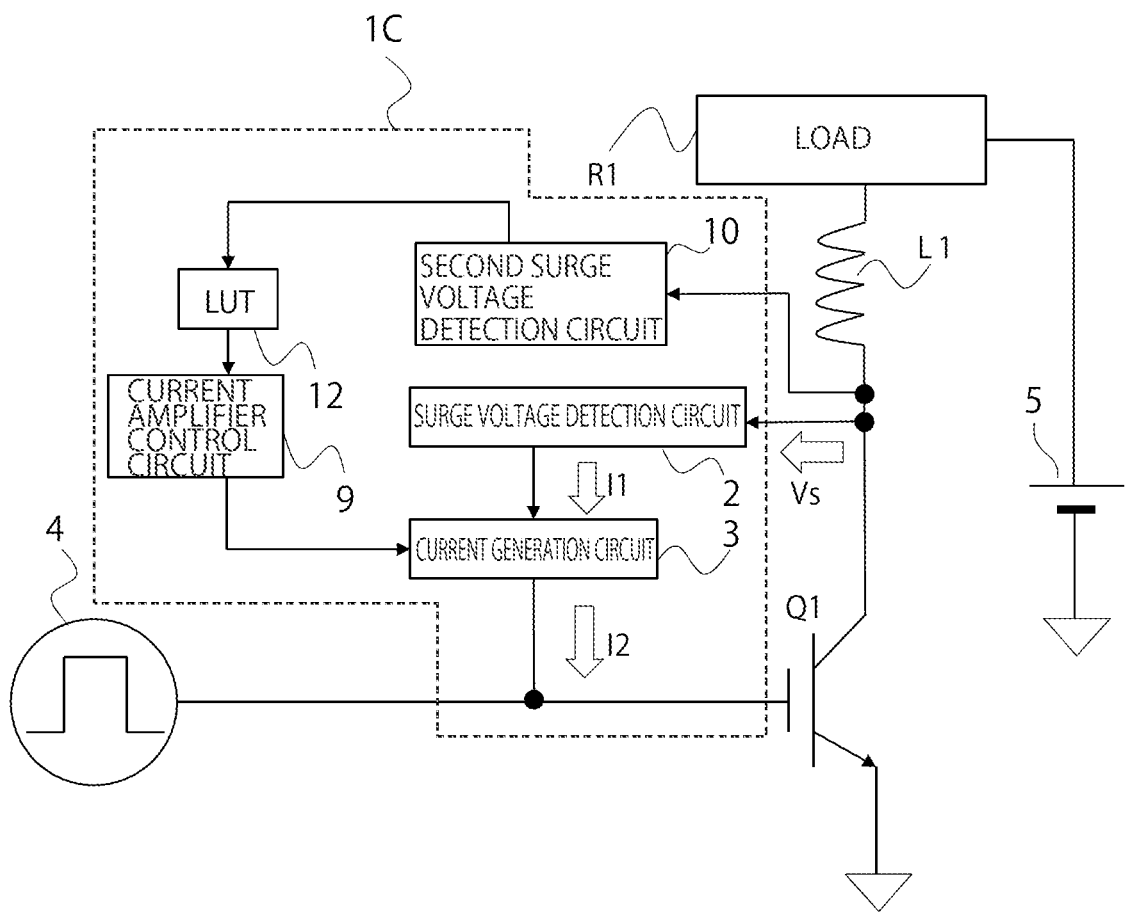
FIG. 15 is a diagram showing a configuration example of the surge voltage control circuit in which a lookup table is provided.

FIG. 15 shows a configuration example of a surge voltage control circuit 1C that determines the number of switches to be indicated to the current amplifier control circuit 9 based on a lookup table (LUT). A lookup table 12 and the second surge voltage detection circuit 10 are added to the surge voltage control circuit 1A shown in FIG. 12. The operation of the second surge voltage detection circuit 10 is the same as in FIG. 14. As an example, the lookup table 12 stores surge voltage values and numbers of switches associated with each other. The lookup table 12 is information in which the surge voltage values and values indicating the amplification gain are associated with each other. The lookup table 12 identifies the number of switches (amplification gain) or switches corresponding to the value of the surge voltage, and provides an indication signal to turn on the number of switches or the switches identified (indication signal indicating amplification with the identified amplification gain) to the current amplifier control circuit 9. The current amplifier control circuit 9 turns on the number of switches indicated by the indication signal or the switches indicated by the indication signal.

In the configurations in FIG. 13 to FIG. 15, the current supplied to the control terminal of the transistor Q1 can be adjusted by making the current amplification rate of the current generation circuit 3 variable according to the magnitude of the surge voltage. In other words, the surge voltage can be effectively controlled by feedback control.

Although surge voltage values and numbers of switches or certain switches are associated with each other in the lookup table in the example of FIG. 15, values of current that flows when a surge occurs and numbers of switches (amplification gain) or certain switches may be associated with each other. The lookup table is information in which current values and amplification gain values are associated with each other. In order to detect the current that flows when a surge occurs, a current detection circuit for detecting a load current may be provided on the emitter side or collector side of the transistor Q1, for example.

Although values of the surge voltage and numbers of switches or certain switches are associated with each other in the lookup table in the example of FIG. 15, load currents and amplification gains may be associated with each other.

Figure 16:
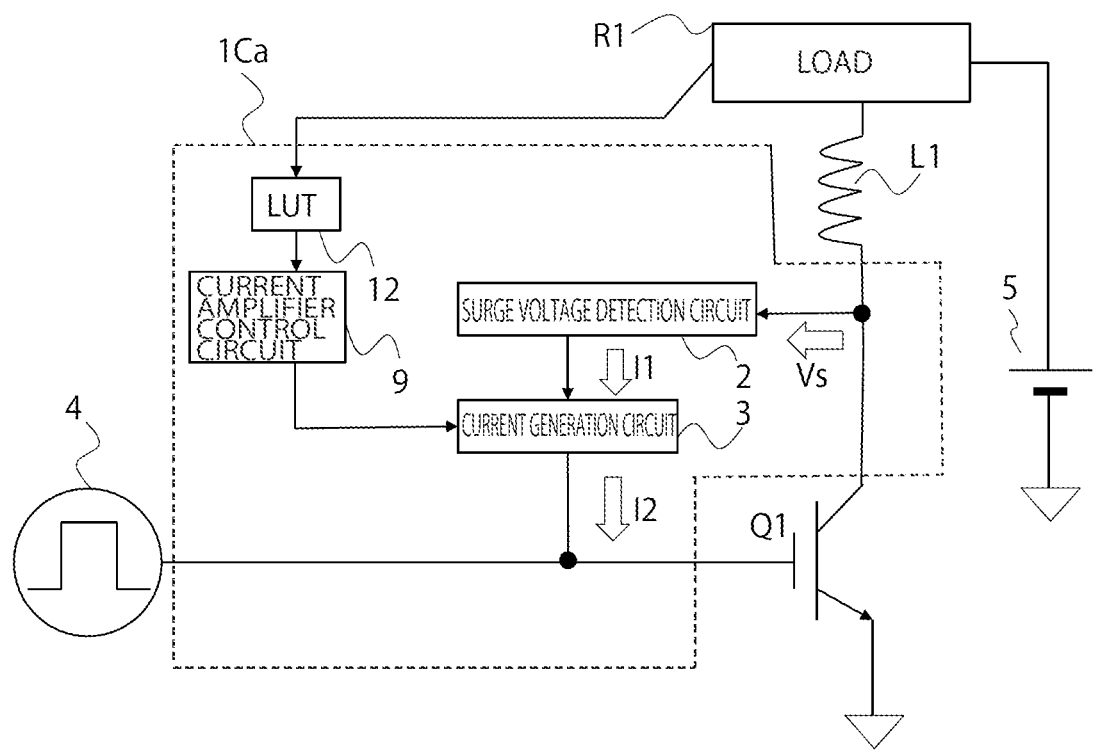
FIG. 16 is a diagram showing another configuration example of the surge voltage control circuit in which a lookup table is provided.

FIG. 16 shows a configuration example of a surge voltage control circuit 1Ca in which load currents and amplification gains are associated with each other in the lookup table 12. Since the load current and the surge voltage are in a monotonic relationship, the surge voltage can be effectively suppressed by using the lookup table in which load currents and amplification gains are associated with each other. The load current can be measured or detected by a current transformer, a sense resistor or a Hall device. Alternatively, since the load current may be predicted by a microcontroller or the like in some control methods for generating the control signal of the transistor Q1, information predicted by the microcontroller (predicted values) and amplification gains may be associated with each other so that the load current may not directly be measured.

Figure 17:
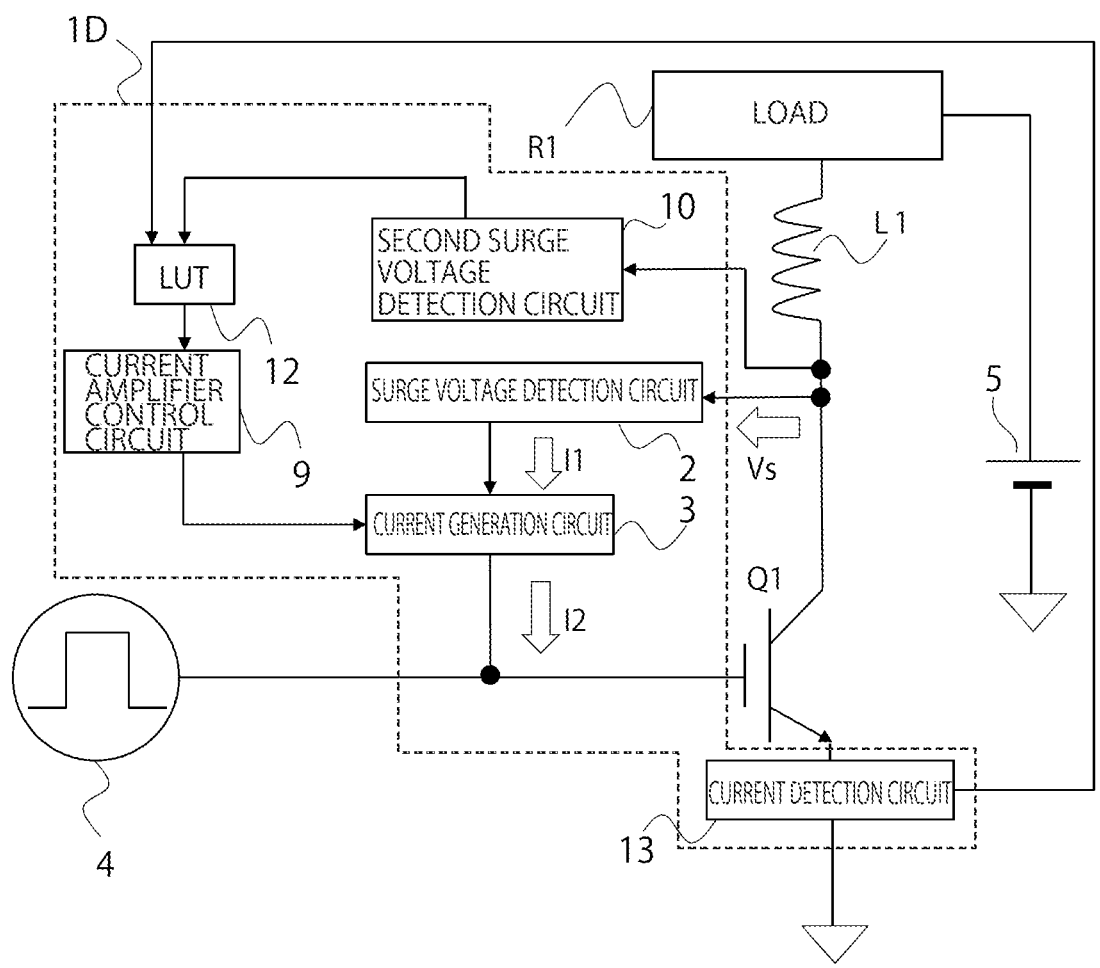
FIG. 17 is a diagram showing an example in which a current detection circuit is provided on an emitter side of a transistor Q1.

FIG. 17 shows an example of a surge voltage control circuit 1D in which a current detection circuit 13 is provided on the emitter side of the transistor Q1. A signal indicating a current detected by the current detection circuit 13 is provided to the lookup table 12. The lookup table 12 identifies the number of switches (amplification gain) or switches corresponding to the current value indicated by the signal, and provides an indication signal to turn on the number of switches or the switches identified (indication signal indicating amplification with the identified amplification gain) to the current amplifier control circuit 9. The current amplifier control circuit 9 turns on the number of switches indicated by the indication signal or the certain switches indicated by the indication signal.

The portion where the current detection circuit is provided is not limited to the emitter side or collector side of the transistor Q1.

Figure 18:
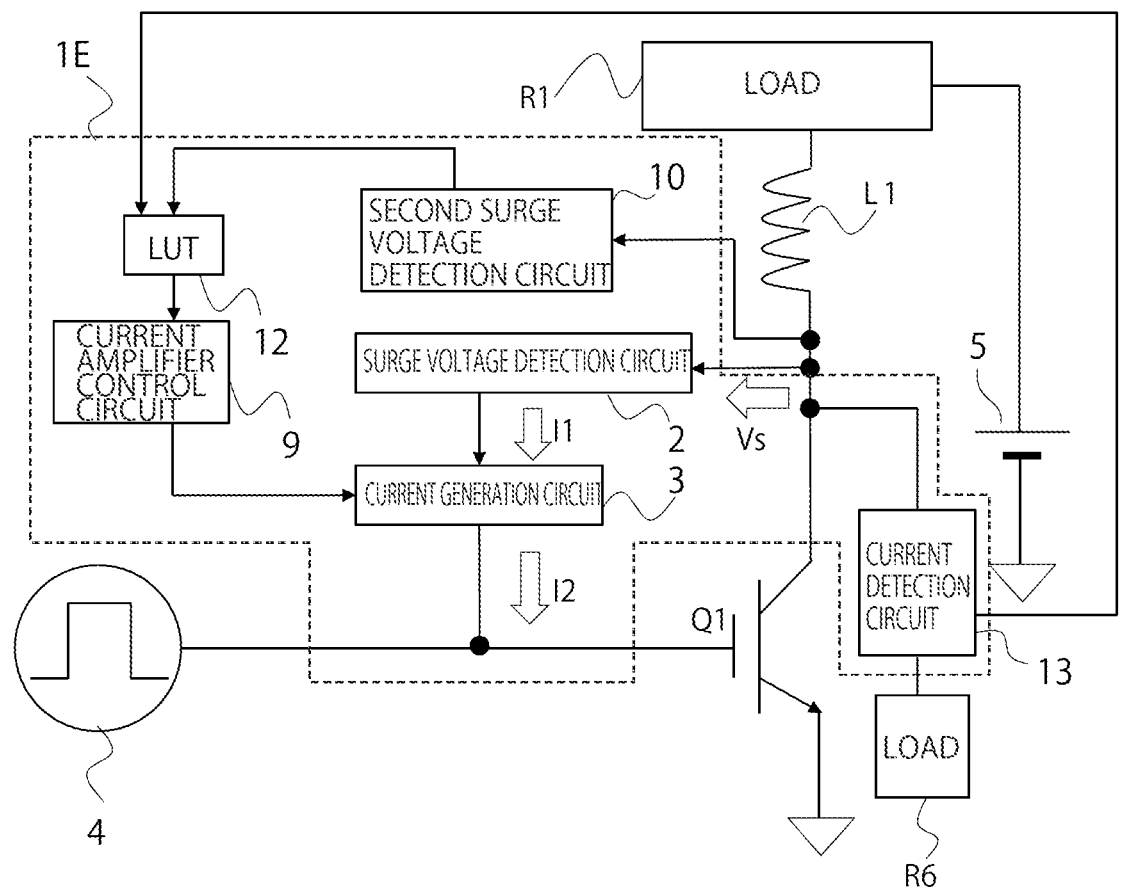
FIG. 18 is a diagram showing an example of a surge voltage control circuit to which a load and a current detection circuit are added.

FIG. 18 shows an example of a surge voltage control circuit 1E to which a load R6 and a current detection circuit 13A are added. The load R6 different from the load R1 is connected in parallel to the transistor Q1 on the collector side of the transistor Q1. The current detection circuit 13A is provided between the load R6 and the collector.

As shown in FIG. 17 and FIG. 18, the surge voltage can be effectively suppressed by performing feedback control based on the lookup table and the detected current value. Since the surge voltage is in a monotonic relationship with the current flowing in the transistor Q1, the surge voltage can be effectively controlled by referring to the current value from the current detection circuit 13 or the current detection circuit 13A. For example, the number of switches to be turned on (amplification gain) or switches necessary to keep the surge voltage to a desired value can be identified from the lookup table, and an indication signal of the identified number of switches to be turned on or turning on the certain switches can be output.

(Variation)

A lookup table may be added subsequent to the surge voltage determination circuit 11 of the surge voltage control circuit 1B in FIG. 14 above. In this case, numbers of switches (amplification gains) or switches may be associated with each of a range above the target value and a range below or equal to the target value in the lookup table.

Third Embodiment

Figure 19:
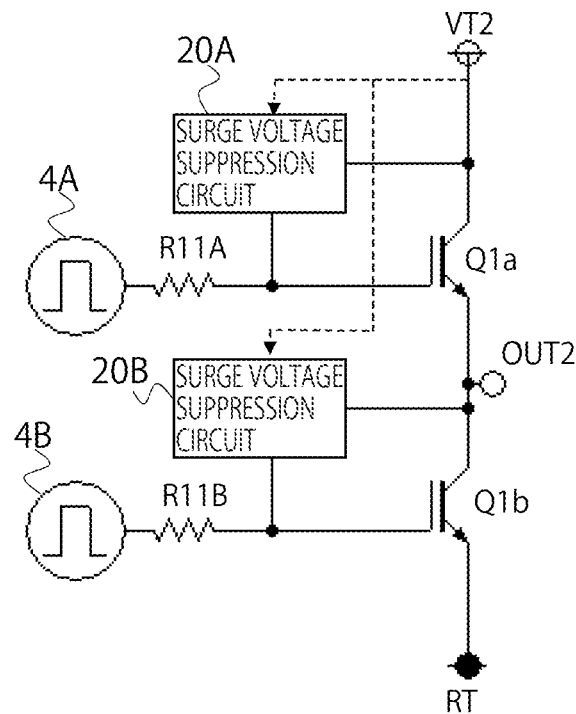
FIG. 19 is a block diagram of a power converter according to a third embodiment.

FIG. 19 is a block diagram of a power converter according to a third embodiment. The power converter in FIG. 19 is a circuit for generating an AC voltage by using a power supply (for example, a high-voltage power supply) connected to a power terminal VT2. The power converter in FIG. 19 can be used for an inverter, a DC-DC converter, or a converter.

Transistors Q1a and Q1b, which are two switching devices, are connected in series between the power terminal VT2 and a reference terminal RT. Although IGBTs are used as the switching devices in the example of FIG. 19, N-type MOSFETs or P-type MOSFETs may also be used.

A control signal is supplied from control signal generators 4A and 4B to the gates of the transistors Q1a and Q1b via resistors R11A and R11B at a timing of alternately turning on or off the transistor Q1a and Q1b. An AC voltage is generated by alternately turning on or off the transistors Qua and Q1b. The generated AC voltage is output from an output terminal OUT2 connected at a node between the transistor Q1a and the transistor Q1b.

Surge voltage control circuits 20A and 20B for suppressing surge voltage are connected to the transistors Q1a and Q1b. Any surge voltage control circuit shown in the first embodiment and second embodiment above can be used as the surge voltage control circuits 20A and 20B. The surge voltage control circuit 20A suppresses surge voltage of the collector of the transistor Q1a. The surge voltage control circuit 20B suppresses surge voltage of the collector of the transistor Q1b.

A power supply voltage connected to the power terminal VT2 can be used as a voltage supplied to the bias circuits (see FIG. 4 or the like) of the surge voltage control circuits 20A and 20B (see broken lines in the figure). In this manner, the surge voltage at the beginning of operation can be made common to the surge voltage control circuits 20A and 20B.

FIG. 20 shows a configuration example of a bias circuit 7A of the surge voltage control circuit 20A. The bias circuit of the surge voltage control circuit 20B has a similar configuration.

Figures 20A, 20B:
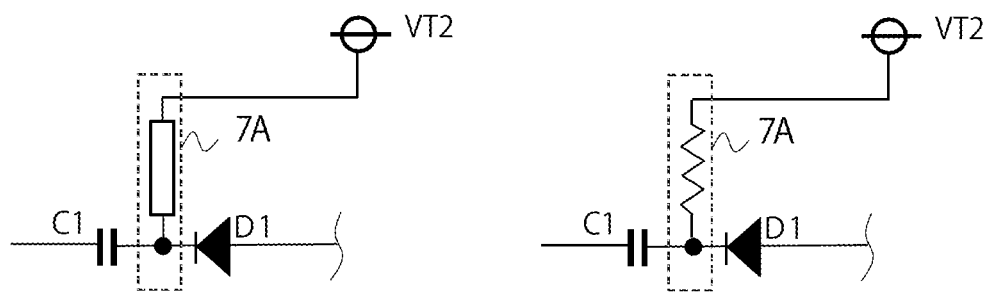
FIGS. 20A and 20B each is a diagram showing a configuration example of a bias circuit.

FIG. 20(A) shows an example in which the power terminal VT2 is connected between the capacitor C1 and the cathode of the diode D1 via a device/circuit having a predetermined impedance. An example of the impedance device may be a resistance or an inductance. It may be omitted when VT2 has high impedance. This mechanism is needed because the voltage of C1 does not change and no displacement current is generated when VT2 has small impedance and they are directly connected.

FIG. 20(B) shows an example in which a resistor R12 is added between the power terminal VT2 and a node between the capacitor C1 and the cathode of the diode D1. A diode may be added between the node and the power terminal VT2.

Fourth Embodiment

Figure 21:
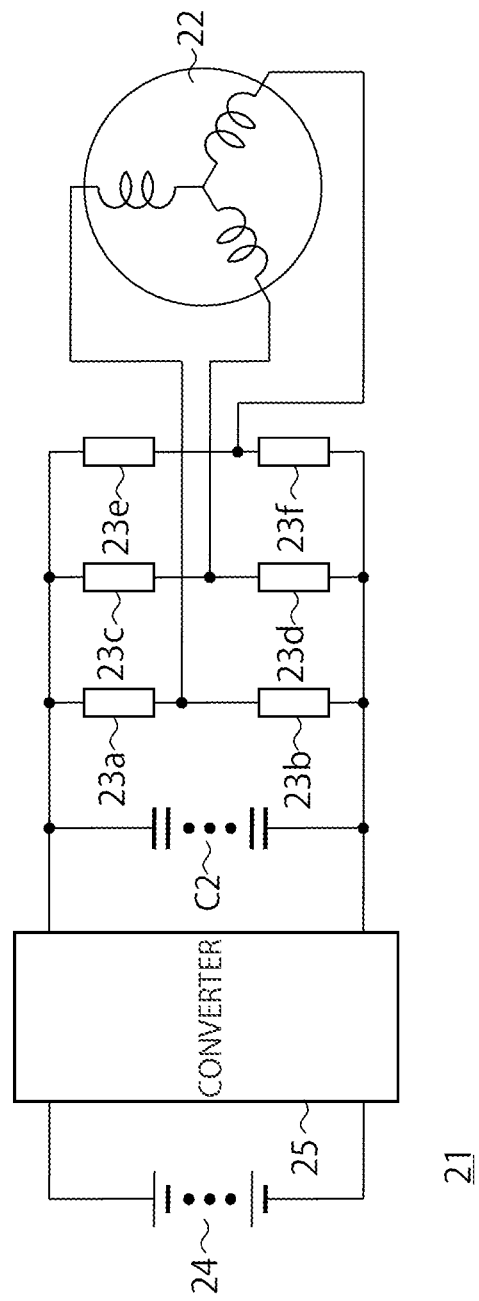
FIG. 21 is a block diagram of a power converter according to a fourth embodiment.

FIG. 21 is a block diagram of a power converter according to a fourth embodiment. The power converter 21 in FIG. 21 is three-phase inverter that generates an AC voltage for driving a three-phase motor 22. The power converter 21 includes a plurality of arms 23a to 23f, a DC power supply 24, a converter 25, and a smoothing capacitor C2.

Each of the plurality of arms 23a to 23f includes any surge voltage control circuit (electronic circuit) shown in the first embodiment or second embodiment described above and a switching device. Each of the arms 23a to 23f performs an operation of turning on or off at a predetermined timing.

The converter 25 is a DC-DC converter, and converts the DC voltage from the DC power supply 24 into a DC voltage at a different voltage level. The smoothing capacitor C2 smoothens the voltage output from the converter 25.

Two arms that form a pair out of the arms 23a to 23f are simultaneously turned on to pass a current into a corresponding coil in the three-phase motor 22. Three-phase driving of the motor can be performed by sequentially changing the two arms simultaneously turned on. In other words, a three-phase alternating current can be generated from the DC voltage of the DC power supply 24 by sequentially changing the pair of switching devices simultaneously turned on. Simultaneously turning on the two arms does not necessarily mean that their start timings of turning on are equal to each other as long as the two arms are simultaneously turned on for at least a partial period of time.

In each embodiment described above, a P-type MOSFET may be used instead of an N-type MOSFET, and an N-type MOSFET may be used instead of a P-type MOSFET. Also, in each embodiment described above, a bipolar transistor or an IGBT may be used instead of each MOSFET.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. Electronic circuitry comprising:
   a first surge voltage detection circuit configured to detect a surge voltage generated due to switching of a switching device and generate a first signal indicating a first current; and
   a current generation circuit configured to generate a second current larger than the first current by amplifying the first current in response to input of the first signal and output the second current to a control terminal of the switching device,
   wherein the first surge voltage detection circuit includes:
   a first diode configured to pass a current input to the first surge voltage detection circuit;
   a capacitor provided between the first diode and the current generation circuit; and
   a bias circuit configured to supply a bias voltage to a cathode of the first diode.

2. The electronic circuitry according to claim 1, wherein the first surge voltage detection circuit is configured to generate the first signal based on the surge voltage or a current generated in response to the surge voltage.

3. The electronic circuitry according to claim 1, further comprising
   a current amplifier control circuit configured to determine an amplification gain of the first current amplified by the current generation circuit.

4. The electronic circuitry according to claim 3, further comprising
   a current detection circuit configured to detect a third current flowing in the switching device, wherein
   the current amplifier control circuit is configured to determine the amplification gain of the first current based on the third current.

5. The electronic circuitry according to claim 4, wherein
   the current amplifier control circuit is configured to determine the amplification gain of the first current based on information corresponding to a value of the third current and the amplification gain.

6. The electronic circuitry according to claim 3, wherein
   the current amplifier control circuit is configured to determine the amplification gain of the first current based on a value of a load current of a load connected to the switching device.

7. The electronic circuitry according to claim 3, further comprising
   a second surge voltage detection circuit configured to detect the surge voltage, wherein
   the current amplifier control circuit is configured to determine the amplification gain of the first current based on the detected surge voltage.

8. The electronic circuitry according to claim 7, wherein
   the current amplifier control circuit is configured to determine the amplification gain of the first current based on whether the surge voltage is greater than or equal to a threshold.

9. The electronic circuitry according to claim 7, wherein
   the current amplifier control circuit is configured to determine the amplification gain of the first current based on information corresponding to a value of the surge voltage and the amplification gain.

10. The electronic circuitry according to claim 1, wherein
the current generation circuit is a current mirror circuit, and
the current mirror circuit includes:
a first transistor connected to the capacitor;
a second transistor having a second control terminal connected to a first control terminal of the first transistor; and
a third transistor having a third control terminal connected to the first control terminal of the first transistor.

11. The electronic circuitry according to claim 10, further comprising
a first switch connected to a first terminal of the second transistor, and
a second switch connected to a second terminal of the third transistor.

12. The electronic circuitry according to claim 9, wherein
the current amplifier control circuit is configured to determine the amplification gain of the first current by turning on or off the first switch and the second switch.

13. The electronic circuitry according to claim 10, further comprising
a resistor connected in parallel to the first transistor and having one end connected to the capacitor.

14. The electronic circuitry according to claim 10, further comprising
a second diode connected in parallel to the first transistor, wherein the second diode has a cathode connected to the capacitor.

15. The electronic circuitry according to claim 10, further comprising
a current bias circuit configured to supply a bias current to the first control terminal, the second control terminal and the third control terminal.

16. An electronic apparatus comprising:
a first switching device;
a first surge voltage detection circuit configured to detect a surge voltage generated due to switching of the first switching device and generate a first signal indicating a first current;
a first current generation circuit configured to generate a second current larger than the first current by amplifying a current in response to input of the first signal and output the second current to a control terminal of the first switching device;
a second switching device connected in series to the first switching device and configured to be turned on or off out of synchronization with the first switching device;
a second surge voltage detection circuit configured to detect a surge voltage generated due to switching of the second switching device and generate a second signal indicating a third current; and
a second current generation circuit configured to generate a fourth current larger than the third current in response to input of the second signal and output the fourth current to a control terminal of the second switching device.

17. The apparatus according to claim 16, further comprising:
a first diode configured to pass a current input to the first surge voltage detection circuit;
a first capacitor provided between the first diode and the first current generation circuit;
a first bias circuit configured to supply a first bias voltage to a cathode of the first diode;
a second diode configured to pass a current input to the second surge voltage detection circuit;
a second capacitor provided between the second diode and the second surge voltage detection circuit; and
a second bias circuit configured to supply a second bias voltage to a cathode of the second diode, wherein
the first bias circuit is configured to supply the first bias voltage based on a voltage of a power supply connected to a first terminal of the first switching device, and
the second bias circuit is configured to supply the second bias voltage based on the voltage of the power supply.

18. An electronic apparatus comprising:
a plurality of pairs of switching devices; and
surge voltage control circuits corresponding to the switching devices in the plurality of pairs of switching devices, wherein
each of the surge voltage control circuits includes:
a surge voltage detection circuit configured to detect a surge voltage generated due to switching of the switching device corresponding the surge voltage control circuit and generate a first signal indicating a first current; and
a current generation circuit configured to generate a second current larger than the first current by amplifying a current in response to input of the first signal and output the second current to a control terminal of the switching device, wherein
the electronic apparatus generates an alternating current from a DC voltage by sequentially changing a pair of the switching devices which is simultaneously turned on for at least a partial period of time.

19. Electronic circuitry comprising:
a first surge voltage detection circuit configured to detect a surge voltage generated due to switching of a switching device and generate a first signal indicating a first current;
a current generation circuit configured to generate a second current larger than the first current by amplifying a current in response to input of the first signal and output the second current to a control terminal of the switching device;
a current amplifier control circuit configured to determine an amplification gain of the first current amplified by the current generation circuit; and
a current detection circuit configured to detect a third current flowing in the switching device,
wherein the current amplifier control circuit is configured to determine the amplification gain of the first current based on the third current.

20. Electronic circuitry comprising:
a first surge voltage detection circuit configured to detect a surge voltage generated due to switching of a switching device and generate a first signal indicating a first current;
a current generation circuit configured to generate a second current larger than the first current by amplifying a current in response to input of the first signal and output the second current to a control terminal of the switching device;
a current amplifier control circuit configured to determine an amplification gain of the first current amplified by the current generation circuit; and
a second surge voltage detection circuit configured to detect the surge voltage,
wherein the current amplifier control circuit is configured to determine the amplification gain of the first current based on the detected surge voltage.

* * * * *